United States Patent
Nakajima

(10) Patent No.: US 10,425,074 B2
(45) Date of Patent: Sep. 24, 2019

(54) SEMICONDUCTOR APPARATUS

(71) Applicant: Renesas Electronics Corporation, Koutou-ku, Tokyo (JP)

(72) Inventor: Sakae Nakajima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 325 days.

(21) Appl. No.: 15/496,400

(22) Filed: Apr. 25, 2017

(65) Prior Publication Data

US 2018/0013414 A1 Jan. 11, 2018

(30) Foreign Application Priority Data

Jul. 11, 2016 (JP) .................................. 2016-136822

(51) Int. Cl.
| | |
|---|---|
| *H03K 17/284* | (2006.01) |
| *H03K 17/082* | (2006.01) |
| *H01L 27/02* | (2006.01) |
| *H01L 27/092* | (2006.01) |
| *H02H 5/04* | (2006.01) |
| *H03K 17/22* | (2006.01) |
| *H02H 9/02* | (2006.01) |
| *H02H 3/08* | (2006.01) |

(52) U.S. Cl.
CPC ..... *H03K 17/0822* (2013.01); *H01L 27/0266* (2013.01); *H01L 27/0922* (2013.01); *H01L 27/0928* (2013.01); *H02H 5/044* (2013.01); *H03K 17/223* (2013.01); *H02H 3/08* (2013.01); *H02H 9/025* (2013.01); *H03K 17/284* (2013.01)

(58) Field of Classification Search
USPC .................................... 361/86–87, 93.7–93.9
See application file for complete search history.

(56) References Cited

U.S. PATENT DOCUMENTS

| 7,443,641 | B2 | 10/2008 | Suzuki | |
|---|---|---|---|---|
| 2011/0110009 | A1* | 5/2011 | Sugimoto | H03K 17/0822 361/93.1 |
| 2016/0087422 | A1* | 3/2016 | Mourrier | H02H 7/0844 361/86 |

FOREIGN PATENT DOCUMENTS

JP 2007-089239 A 4/2007

* cited by examiner

*Primary Examiner* — Danny Nguyen
(74) *Attorney, Agent, or Firm* — Shapiro, Gabor and Rosenberger, PLLC

(57) ABSTRACT

There has been a problem in semiconductor apparatuses of related art in which a circuit operation cannot be returned after a reverse current occurred. In one embodiment, a semiconductor apparatus includes a timer block configured to count up a count value to a predetermined value in response to a control signal being enabled, the control signal instructing a power MOS transistor to be turned on, and a protection transistor including a drain connected to a gate of the power MOS transistor, a source and a back gate connected to a source of the power MOS transistor, and an epitaxial layer in which the power MOS transistor is formed, the epitaxial layer being supplied with a power supply voltage. The protection transistor short-circuits the source and gate of the power MOS transistor in response to an output voltage of the power MOS transistor meeting a predetermined condition and the count value reaching the predetermined value. The timer block resets the count value when the output voltage of the power MOS transistor no longer meets the predetermined condition.

6 Claims, 15 Drawing Sheets

SEMICONDUCTOR APPARATUS

CROSS-REFERENCE TO RELATED APPLICATIONS

This application is based upon and claims the benefit of priority from Japanese patent application No. 2016-136822, filed on Jul. 11, 2016, the disclosure of which is incorporated herein in its entirety by reference.

BACKGROUND

The present invention relates to a semiconductor apparatus and, for example, to a semiconductor apparatus including a driving circuit for driving a power MOS transistor and a protection circuit for protecting the power MOS transistor.

Recently, power MOS transistors have been increasingly used as switches for switching whether or not power is supplied to circuits. A switch IC using such a power MOS transistor needs a driving circuit for driving a MOS transistor, and a protection circuit for overheat protection of the MOS transistor, load short-circuit protection, and the like. Thus, Japanese Unexamined Patent Application Publication No. 2007-89239 discloses an example of a short-circuit protection circuit for protecting a MOS transistor when a load driven by the MOS transistor is short-circuited.

Japanese Unexamined Patent Application Publication No. 2007-89239 discloses a timer latch short-circuit protection circuit. This timer latch short-circuit protection circuit is composed of a detection circuit, a delay circuit, and a latch circuit. The delay circuit is reset by an output voltage abnormal signal of a switching regulator output by the latch circuit, and the latch circuit is reset by a sum of the output voltage abnormal signal and an UVLO signal.

SUMMARY

Loads driven by the switch IC include an inductive load for generating a counter electromotive force, a capacitive load for holding accumulated electric charge for a certain period of time, and the like. When driving such an inductive load or a capacitive load, a reverse current in which a current flows from the source to the drain of the power MOS transistor may occur depending on conditions. Such a reverse current flows into a power supply line through a diode formed in a back gate of the power MOS transistor. However, when the reverse current occurs, a voltage of an output terminal will become higher than the power supply voltage, thereby causing a problem in which the protection circuit malfunctions due to such an abnormal voltage and the semiconductor apparatus cannot return from a protection state where the power MOS transistor is turned off after the reverse current occurs.

The other objects or problems and novel features will be made apparent from the following description and the accompanying drawings.

An example aspect is a semiconductor apparatus includes a timer block configured to count up a count value to a predetermined value in response to a control signal being enabled, the control signal instructing a power MOS transistor to be turned on, and a protection transistor including a drain connected to a gate of the power MOS transistor, a source and a back gate connected to a source of the power MOS transistor, and an epitaxial layer supplied with a power supply voltage. The protection transistor short-circuits the source and gate of the power MOS transistor in response to an output voltage of the power MOS transistor meeting a predetermined condition and the count value reaching the predetermined value. The timer block resets the count value when the output voltage of the power MOS transistor no longer meets the predetermined condition.

According to the example aspect, it is possible to prevent a malfunction of a protection transistor when a reverse current occurs.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The following descriptions and drawings are simplified as appropriate for clarity of the descriptions. The same elements are denoted by the same reference signs, and repeated descriptions are omitted.

Figure 1:
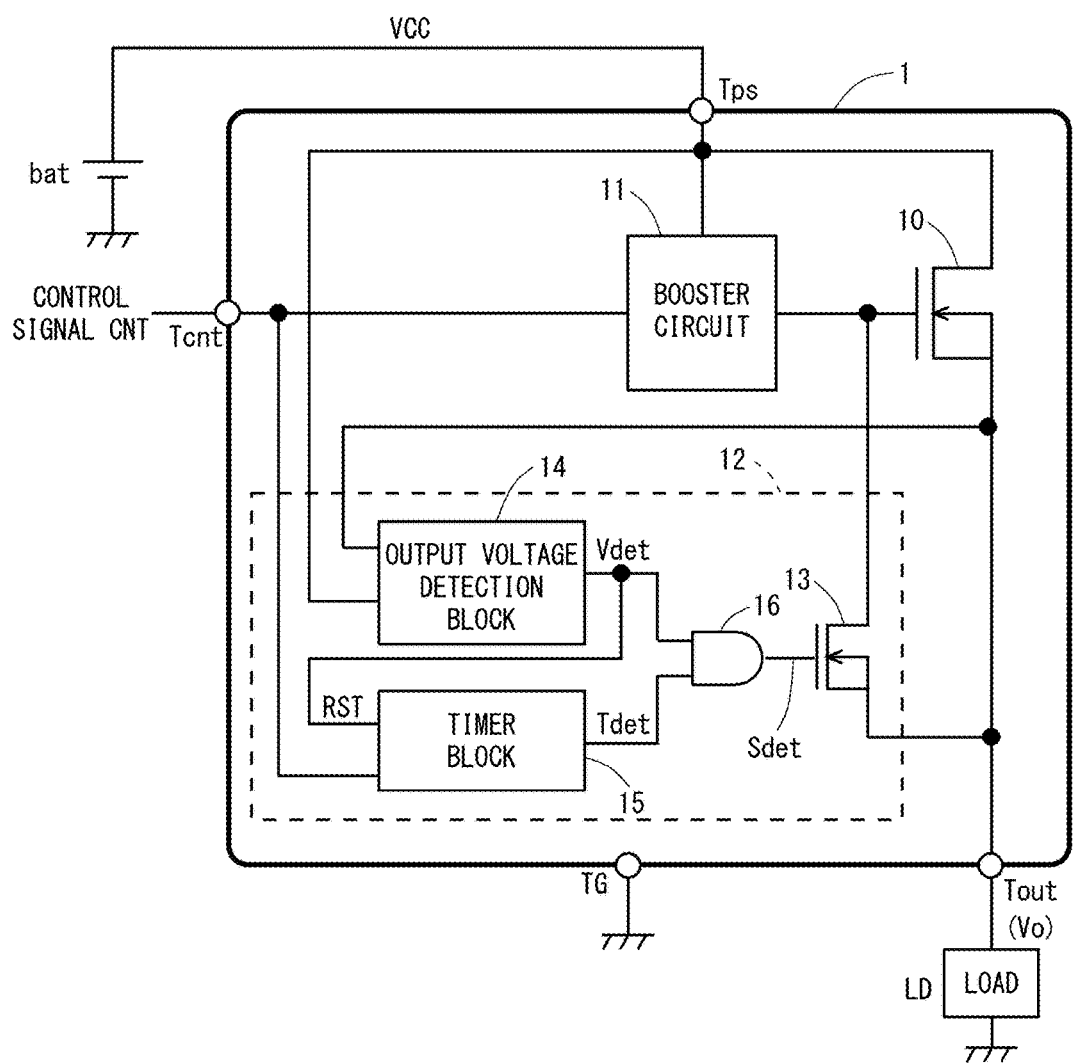
FIG. 1 is a block diagram of a semiconductor apparatus according to a first embodiment.

FIG. 1 is a block diagram of a semiconductor apparatus according to a first embodiment. As shown in FIG. 1, the semiconductor apparatus 1 according to the first embodiment includes a power MOS transistor 10, a booster circuit 11, and a protection circuit 12. The semiconductor apparatus 1 according to the first embodiment further includes a control signal input terminal Tcnt, a power supply terminal Tps, a ground terminal TG, and an output terminal Tout as external terminals. Moreover, a load circuit LD is provided between the output terminal Tout and a ground line. The semiconductor apparatus 1 according to the first embodiment has a switch function for switching whether or not to supply a power supply voltage VCC to the load circuit LD by switching the conduction state of the power MOS transistor 10.

The power MOS transistor 10 is, for example, a vertical MOS transistor that passes a current in a depth direction of the substrate. Moreover, the power MOS transistor 10 is an N-type MOS transistor. In a semiconductor apparatus, a transistor having N-type conductive characteristics has higher carrier mobility than a transistor having P-type conductive characteristics, and if the transistors have the same area, the transistor having N-type conductive characteristics can pass more currents than the transistor having P-type conductive characteristics.

In the power MOS transistor 10, the drain is connected to a power supply terminal Tps and the source is connected to the output terminal Tout. That is, in the power MOS transistor 10, the power supply voltage VCC is supplied to the drain, and the source is connected to the load circuit. An output of the booster circuit 11 is connected to the gate of the power MOS transistor 10. In the power MOS transistor 10, the back gate and the source are commonly connected.

The booster circuit 11 switches whether to supply a boosted voltage, which is the boosted power supply voltage VCC, to the power MOS transistor 10 or to supply a voltage including a ground voltage GND to the power MOS transistor 10 according to a logical level of a control signal CNT input through a control signal input terminal Tcnt. More specifically, when the control signal CNT indicates that the power MOS transistor 10 is to be turned on (control signal CNT=high level), the booster circuit 11 supplies the boosted voltage to the gate of the power MOS transistor 10. On the contrary, when the control signal CNT indicates that the power MOS transistor 10 is to be turned off (control signal CNT=low level), the booster circuit 11 supplies the ground voltage GND to the gate of the power MOS transistor 10.

The protection circuit 12 protects the power MOS transistor 10 by turning off the power MOS transistor 10 when an abnormal state such as a short-circuit of the load circuit LD occurs. Moreover, the protection circuit 12 has a function of preventing a malfunction in which the protection circuit 12 turns off the power MOS transistor 10 after a reverse current occurs in the power MOS transistor 10.

The protection circuit 12 includes a protection transistor 13, an output voltage detection block 14, a timer block 15, and a protection start instruction circuit (e.g., AND circuit 16). As will be described in detail later, this protection circuit 12 is formed on the same semiconductor substrate on which the power MOS transistor 10 is formed. That is, the protection circuit 12 is formed on an N-type semiconductor substrate.

The protection transistor 13 is, for example, a transistor of N-type conductivity. In the protection transistor 13, the source is connected to the source of the power MOS transistor 10, the drain is connected to the gate of the power MOS transistor 10, and a protection start signal output from the AND circuit 16 is input to the gate. Further, a back gate of the protection transistor 13 is commonly connected to the source of the protection transistor 13.

The output voltage detection block 14 outputs a voltage determination signal Vdet that is enabled in a period in which a source voltage of the power MOS transistor 10 is determined to be lower than a first threshold voltage Vth obtained by subtracting a predetermined first determination voltage Voff from the power supply voltage VCC (VCC−Voff).

The timer block 15 counts up a count value Tdet to a predetermined value in response to the control signal CNT for instructing the power MOS transistor 10 to be turned on becoming enabled. It should be noted that the timer block 15 may be composed of a digital circuit or an analog circuit. In the semiconductor apparatus 1 according to the first embodiment, the timer block 15 is composed of an analog circuit.

The AND circuit 16 enables the protection start signal Sdet in response to the voltage determination signal Vdet becoming enabled and the count value Tdet having reached the predetermined value. Specifically, in the AND circuit 16, the voltage determination signal Vdet output from the output voltage detection block 14 is input to one input terminal, and the count value Tdet output from the AND circuit 16 is input to the other input terminal. Then, the AND circuit 16 switches the protection start signal Sdet from a low level to a high level when the two input signals are determined to be in a high level.

Figure 2:
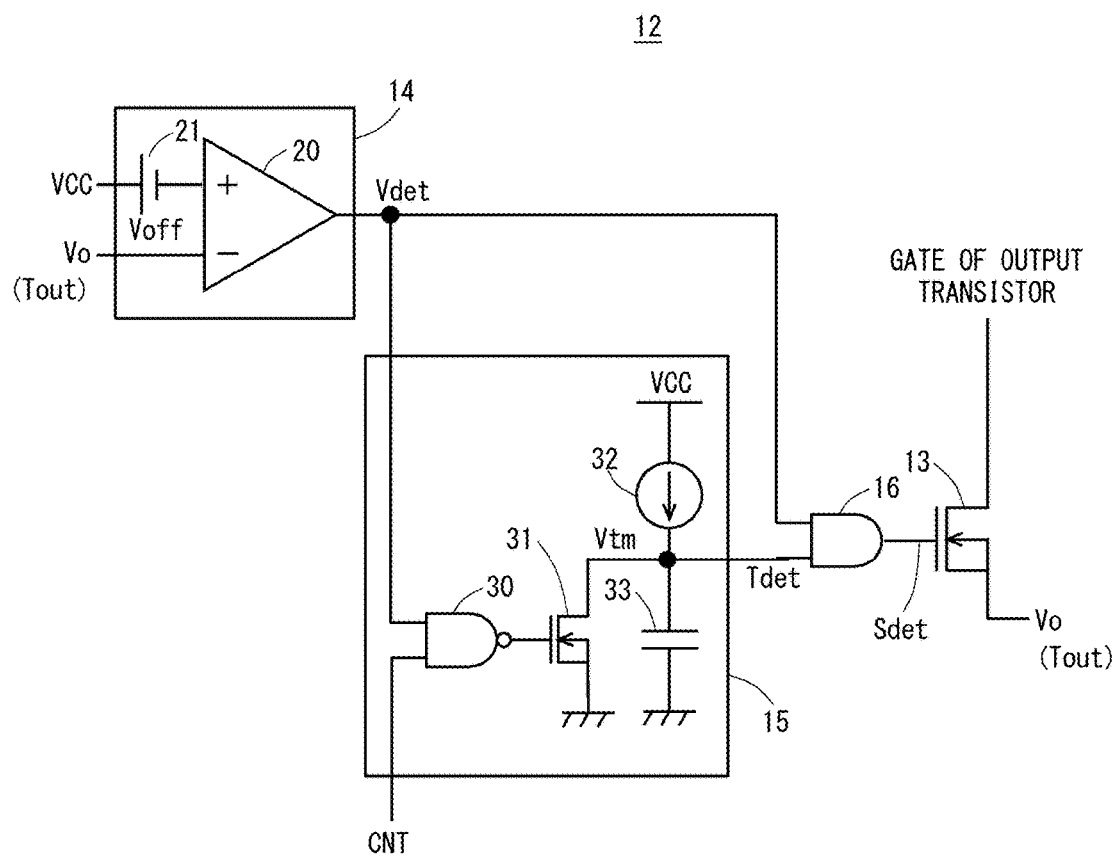
FIG. 2 is a block diagram of a protection circuit according to the first embodiment.

An example of specific circuits of the output voltage detection block 14 and the timer block 15 will be described below. FIG. 2 is a block diagram of the protection circuit 12 according to the first embodiment As shown in FIG. 2, the output voltage detection block 14 includes a comparator 20 and a constant voltage source 21. In the comparator 20, an output voltage Vo is input to an inverting input terminal, and the first threshold voltage Vth obtained by subtracting the first determination voltage Voff from the power supply voltage VCC is input to a non-inverting input terminal. In the constant voltage source 21, a positive electrode is connected to a power supply line, and a negative electrode is connected to the non-inverting input terminal of the comparator 20. As the constant voltage source 21 is inserted between the power supply line and the non-inverting input terminal of the comparator 20, a first threshold voltage obtained by subtracting the first determination voltage Voff from the power supply voltage VCC is supplied to the non-inverting input terminal of the comparator 20. Further, the output voltage Vo is the source voltage of the power MOS transistor 10, and in the semiconductor apparatus 1 according to the first embodiment, it is a voltage that becomes a voltage of the output terminal Tout.

The timer block 15 includes an NAND circuit 30, an NMOS transistor 31, a constant current source 32, and a capacitor 33. The NAND circuit 30 calculates an NAND of the control signal CNT and the voltage determination signal Vdet, and outputs a result of the calculation to the gate of the NMOS transistor 31. In the constant current source 32, one end is connected to a power supply line, and the other end is connected to one end of the capacitor 33. The other end of the capacitor 33 is connected to a ground line. In the NMOS transistor 31, the source is connected to a ground line, the drain is connected to a node connected between the constant current source 32 and the capacitor 33, and an output of the NAND circuit 30 is supplied to the gate.

In a state where the control signal CNT is at the high level and the voltage determination signal Vdet is at the high level, the timer block 15 turns off the NMOS transistor 31 and charges the capacitor 33 by the constant current source 32. As a result, the timer block 15 increases the voltage level of the count value Tdet with time. Further, a maximum value of the count value Tdet of the timer block 15 will become equal to a power supply voltage level. On the other hand, in a state where one of the control signal CNT and the voltage determination signal Vdet is at the low level, the timer block 15 turns on the NMOS transistor 31 to stop charging the capacitor 33 by the constant current source 32, so that the count value Tdet will become a low level (e.g., a ground voltage level).

Figure 3:
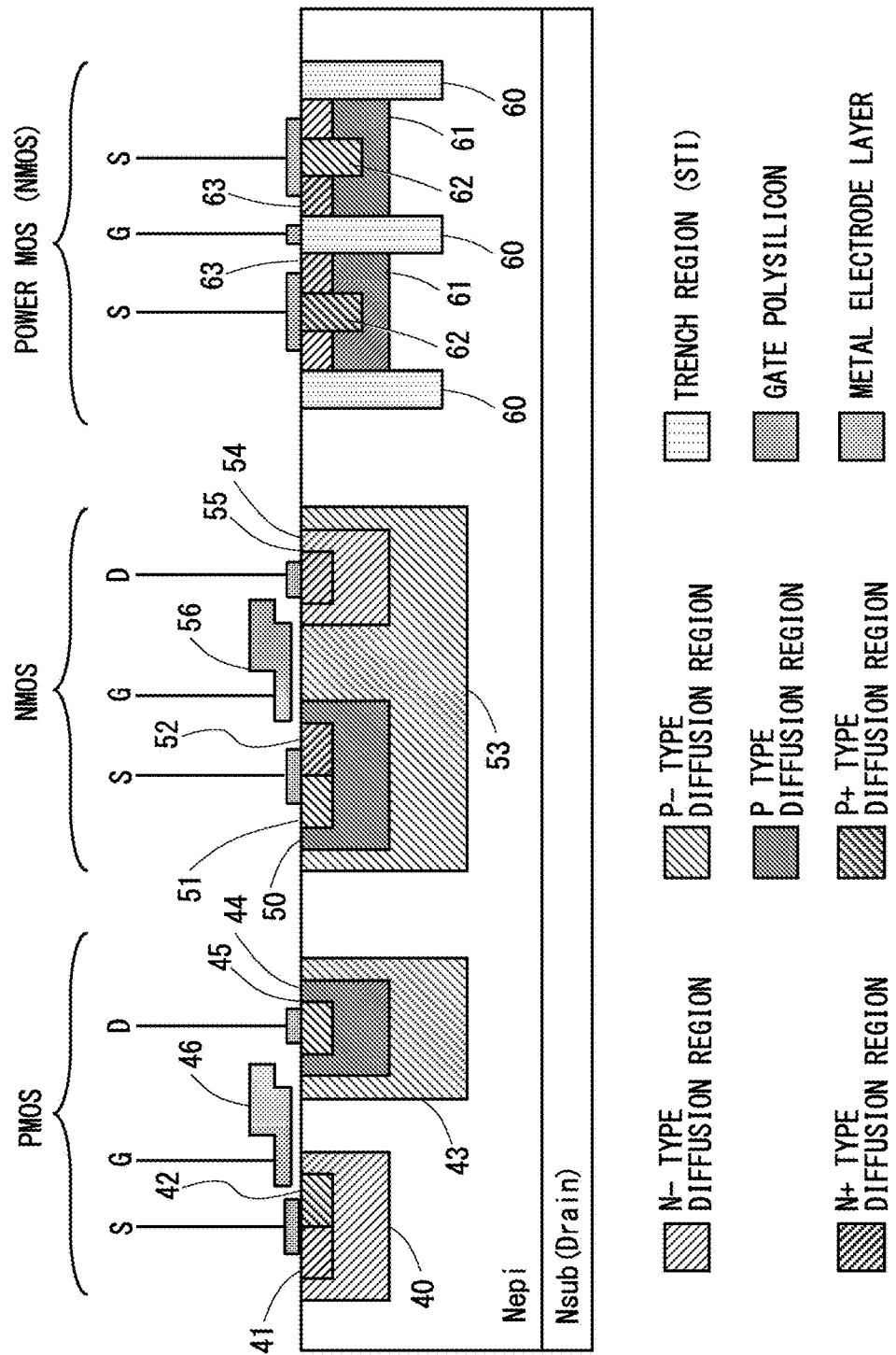
FIG. 3 is a cross-sectional diagram for describing a cross-sectional structure of an element formed on the semiconductor apparatus according to the first embodiment.

Next, a structure of elements constituting the semiconductor apparatus 1 according to the first embodiment will be described. In the semiconductor apparatus 1 according to the first embodiment, elements are formed on an N-type semiconductor substrate. Specifically, in the semiconductor apparatus 1, a vertical NMOS transistor (power NMOS transistor) and a planar MOS transistor for passing a current in the horizontal direction of the substrate are formed on one N-type semiconductor substrate. FIG. 3 is a cross-sectional diagram for describing a cross-sectional structure of the elements formed on the semiconductor apparatus according to the first embodiment. FIG. 3 schematically shows structures of the planar type PMOS transistor and NMOS transistor and the vertical NMOS transistor. As shown in FIG. 3, in the semiconductor apparatus 1 according to the first embodiment, an N sub layer is formed on a surface (e.g., rear surface) opposite to the surface on which the semiconductor elements are formed. This N sub is the drain of the power MOS. Then, an N-type epitaxial layer (N-epi layer) is formed on the upper layer of the N sub layer. The semiconductor elements are formed on the front surface of the N-epi layer.

The planar PMOS transistor (hereinafter simply referred to as a PMOS transistor) has a source region and a drain region formed in a surface layer of the N-epi layer, and a gate electrode 46 formed above a front surface of the semiconductor substrate. In the source region, an N well contact 41 and a source contact 42 are formed in the surface layer of an N well region 40. A metal electrode layer is commonly formed on the N well contact 41 and source contact 42, and a line is connected to this metal electrode layer. In the drain region, a P well region 44 is formed in the surface layer of the P well region 43. Further, a drain contact 45 is formed in the surface layer of the P well region 44. A metal electrode layer is formed on the upper layer of the drain contact 45, and a line is connected to this metal electrode layer.

Note that the N well region 40 is an N− type diffusion region with a low impurity concentration, the N well contact 41 is an N+ type diffusion region with a high impurity concentration, the P well region 43 is a P− type diffusion region with a low impurity concentration, the P well region 44 is a P type diffusion region with a standard impurity concentration, and the source contact 42 and the drain contact 45 are P+ type diffusion regions with high impurity concentrations.

A planar NMOS transistor (hereinafter simply referred to as NMOS transistor) has a source region and a drain region formed in a surface layer of the N-epi layer and a gate electrode 56 formed above the surface of the semiconductor substrate. In the NMOS transistor, the P well region 50 and the N well region 54 are formed in the surface layer of the P well region 53. In the source region, a P well contact 51 and a source contact 52 are formed in the surface layer of the P well region 50. A metal electrode layer is commonly formed on the P well contact 51 and the source contact 52, and a line is connected to this metal electrode layer. In the drain region, a drain contact 55 is formed in the surface layer of the N well region 54. A metal electrode layer is formed on the drain contact 55, and a line is connected to this metal electrode layer.

Note that the P well region 50 is a P type diffusion region with a standard impurity concentration, the P well contact 51 is a P+ type diffusion region with a high impurity concentration, the P well region 53 is a P− type diffusion region with a low impurity concentration, the N well region 54 is an N− type diffusion region with a low impurity concentration, and the source contact 52 and the drain contact 55 are N+ type diffusion regions with high impurity concentrations.

The power MOS transistor includes trenches 60 formed in the surface layer of the N-epi layer, a source region formed in the surface layer of the N-epi layer, and a drain region formed in the lower layer of the N-epi layer. The trenches 60 are formed to extend in the depth direction of the semiconductor substrate. Channel regions 61 are formed between the trenches 60. P+ diffusion regions 62 and source contacts 63 are formed in the surface layer of the channel regions 61. The P+ diffusion regions 62 are formed to be surrounded by the source contacts 63. Metal electrode layers are formed across the P+ diffusion regions 62 and source contacts 63, and source lines are connected to the metal electrode layers. Another metal electrode layer is formed on the surface layer of the trench 60, and a gate line is connected to this metal electrode layer.

In the power MOS transistor, when a voltage is applied to the trenches 60, channels are formed in the region along the trenches 60 from the source contact 63 to the N-epi layer, and currents flow through these channels.

Figure 4:
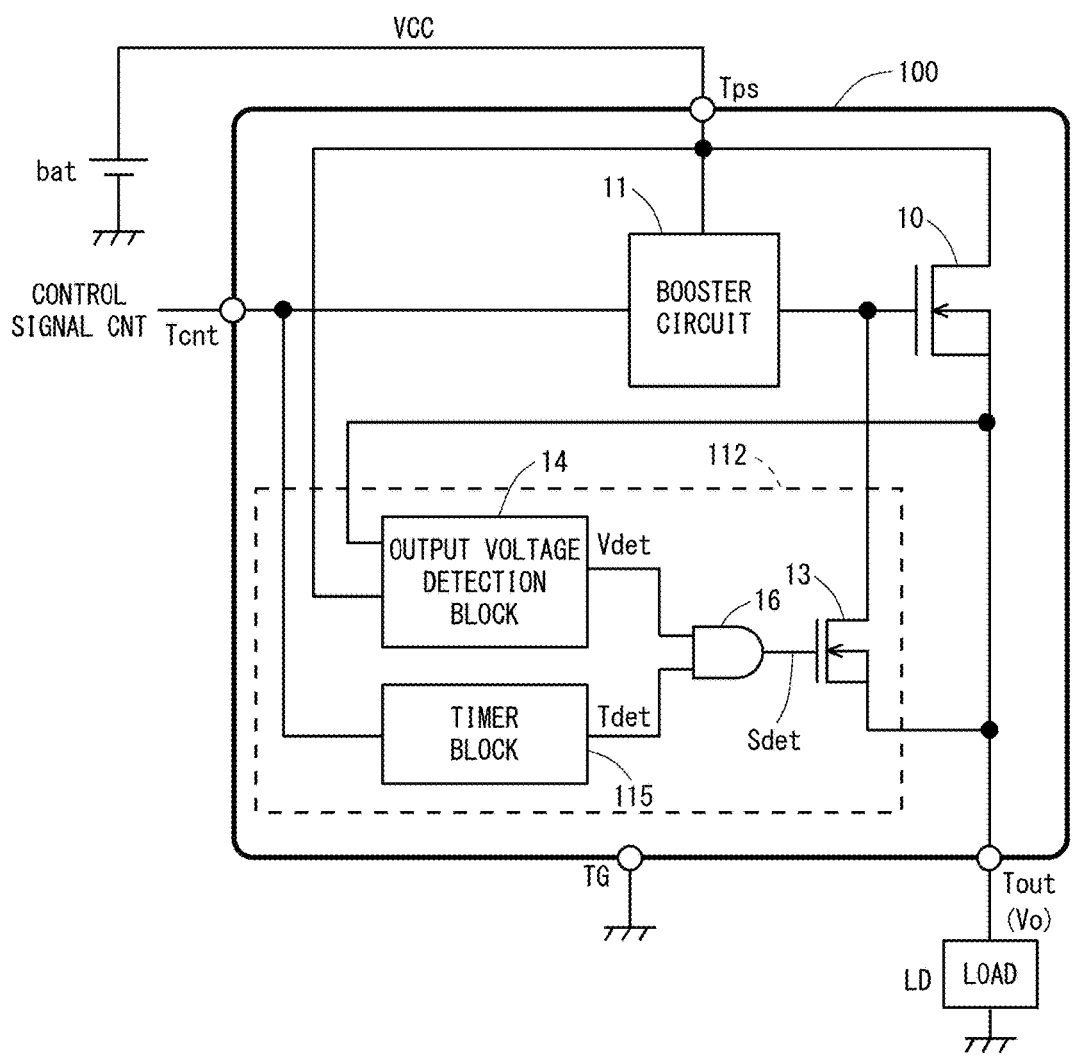
FIG. 4 is a block diagram of a semiconductor apparatus according to a comparative example.

In the semiconductor apparatus 1 according to the first embodiment, a parasitic transistor is formed in the NMOS transistor that constitutes the protection transistor 13 when the reverse current occurs based on the above element structure. By a behavior of the parasitic transistor, the power MOS transistor 10 is turned off when the reverse current occurs. Details of the parasitic transistor and an operation of the semiconductor apparatus 1 when the reverse current occurs will be described later Next, an operation of the semiconductor apparatus 1 according to the first embodiment will be described. The operation of the semiconductor apparatus 1 will be described with a comparison between a semiconductor apparatus 100 according to a comparative example and the semiconductor apparatus 1 according to the first embodiment. FIG. 4 is a block diagram of the semiconductor apparatus 100 according to the comparative example.

As shown in FIG. 4, the semiconductor apparatus 100 according to the comparative example includes a protection circuit 112 in place of the protection circuit 12. The protection circuit 112 has a timer block 115 in place of the timer block 15. A difference between the timer block 115 and the timer block 15 is that the timer block 115 does not include the reset function that operates according to the voltage determination signal Vdet output by the output voltage detection block 14.

Figure 5:
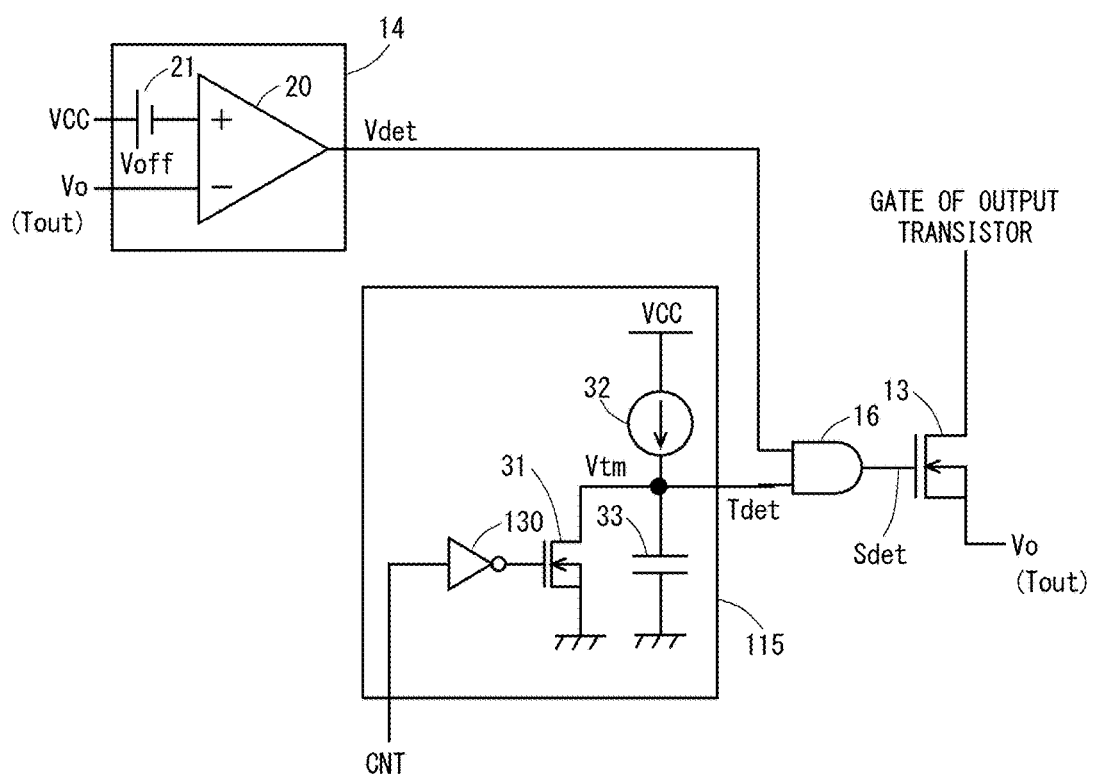
FIG. 5 is a block diagram of a protection circuit according to the comparative example.

FIG. 5 shows an example of a circuit of the timer block 115. As shown in FIG. 5, the timer block 115 includes an inverter 130 in place of the NAND circuit 30. The NMOS transistor 31 is turned on and off according to an inverted signal of the control signal CNT provided through the inverter 130.

Figure 6:
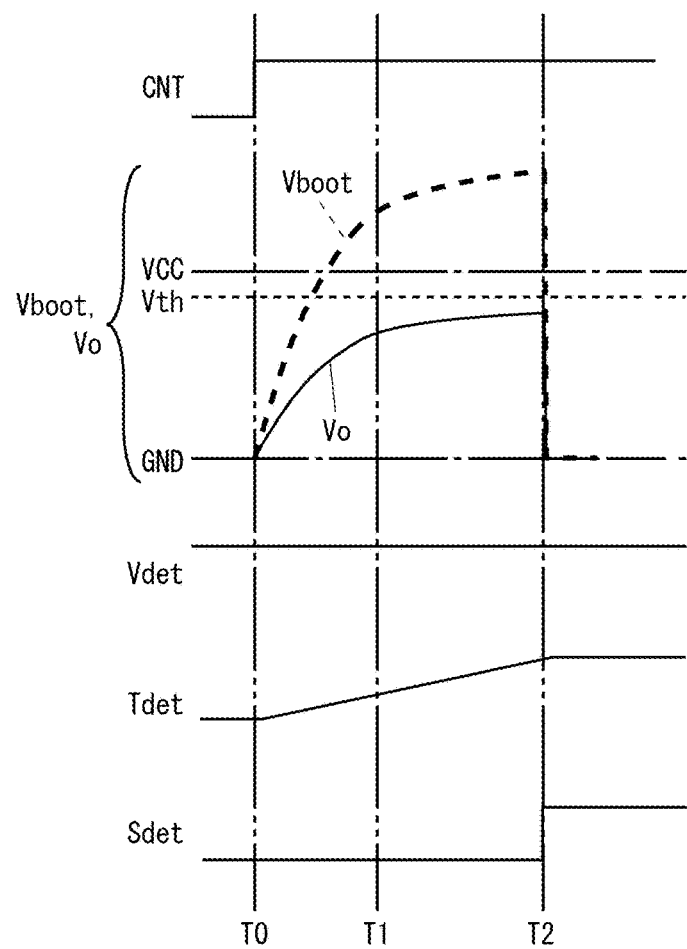
FIG. 6 is a timing chart for describing an operation of the semiconductor apparatus according to the first embodiment when a short-circuit protection function operates.

Next, an operation of the semiconductor apparatus 1 according to the first embodiment when a short-circuit occurs in the load circuit LD will be described. Note that an operation of the semiconductor apparatus 1 according to the first embodiment when a short-circuit occurs in the load circuit LD is the same as that of the semiconductor apparatus 100 according to the comparative example. FIG. 6 is a timing chart for describing an operation of the semiconductor apparatus according to the first embodiment when the short-circuit protection function operates.

As shown in FIG. 6, when the control signal CNT is changed from the low level to the high level at the timing T0, the booster circuit 11 boosts a voltage of an output signal Vboot to a predetermined boosted voltage. However, when a short-circuit occurs in the load circuit LD, since a load current flowing through the power MOS transistor 10 becomes greater than a specified current value, the output voltage Vo does not rise to the first threshold voltage Vth. When the count value Tdet reaches a maximum value at the timing T2, since the voltage determination signal Vdet at that time is at the high level, the protection start signal Sdet is switched from the low level to the high level, and the protection transistor 13 is switched from the off state to the on state, and thus the gate and source of the power MOS transistor 10 are short-circuited. As a result, since the power MOS transistor 10 is switched from the on state to the off state, no more current flows through the power MOS transistor 10, and thus the power MOS transistor 10 is protected.

Figure 7:
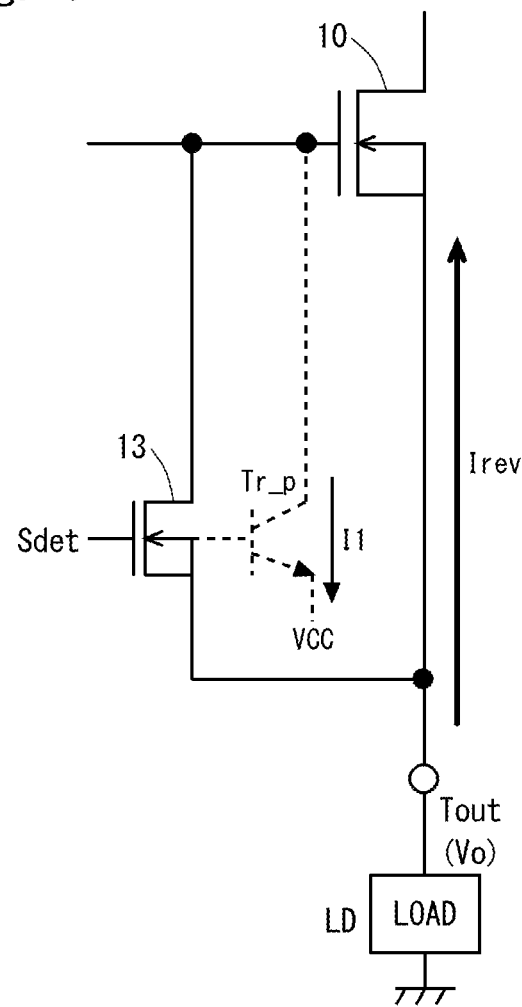
FIG. 7 is a circuit diagram for describing a parasitic element that operates when a reverse current occurs in the semiconductor apparatus according to the first embodiment.

Next, the operation of the semiconductor apparatus 1 according to the first embodiment when the reverse current occurs will be described. When the reverse current occurs, the output voltage Vo becomes higher than the power supply voltage VCC, and a reverse current Irev flows through a body diode formed in the back gate of the power MOS transistor 10. Moreover, when the reverse current Irev flows, since a voltage of the back gate of the protection transistor 13 becomes higher than the power supply voltage VCC, a parasitic transistor Tr_p caused by the element structure of the protection transistor 13 is activated. FIG. 7 is a circuit diagram for describing a parasitic element that operates when the reverse current occurs in the semiconductor apparatus according to the first embodiment.

As shown in FIG. 7, in the parasitic transistor Tr_p, the base is connected to the back gate of the protection transistor 13, the collector is connected to the gate of the power MOS transistor 10, and the power supply voltage VCC is supplied to the emitter. When the reverse current flows, a current flows from the output terminal Tout to the power supply terminal Tps through the body diode formed in the back gate of the power MOS transistor 10, and the output voltage Vo is clamped to a voltage higher than the power supply voltage VDD by a forward voltage of the diode. At this time, in the parasitic transistor Tr_p, since the voltage of the base is greater than the voltage of the emitter by a threshold voltage, the parasitic transistor Tr_p is activated. Then, a current I1 is drawn from the gate of the power MOS transistor 10 to the power supply line through the activated parasitic transistor Tr_p.

Figure 8:
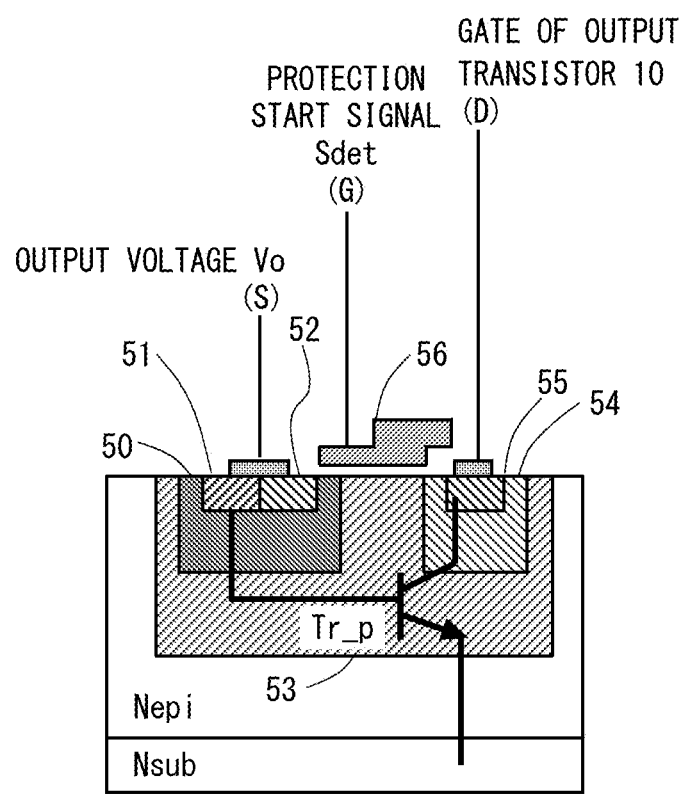
FIG. 8 is a cross-sectional diagram for describing a structure of the parasitic element that operates when a reverse current occurs in the semiconductor apparatus according to the first embodiment.

The element structure of this parasitic transistor Tr_p will be described in more detail. FIG. 8 is a cross-sectional diagram for describing a structure of the parasitic element that operates when the reverse current occurs in the semiconductor apparatus according to the first embodiment. As shown in FIG. 8, the parasitic transistor Tr_p is an NPN transistor in which the P well contact 51 is the base, the drain contact 55 which is an N type diffusion region is the collector, and the N-epi layer is the emitter. Since the power supply voltage is applied to the emitter of this NPN transistor through the N sub region, when a voltage higher than the power supply voltage VCC by a threshold voltage is applied to the P well contact 51, which is the base, the parasitic transistor Tr_p is activated.

Next, the operation of the semiconductor apparatus 1 according to the first embodiment when the reverse current occurs will be described. In order to explain the problem to be solved by the semiconductor apparatus 1 according to the first embodiment, the operation of the semiconductor apparatus 100 according to the comparative example will be described first.

Figure 9:
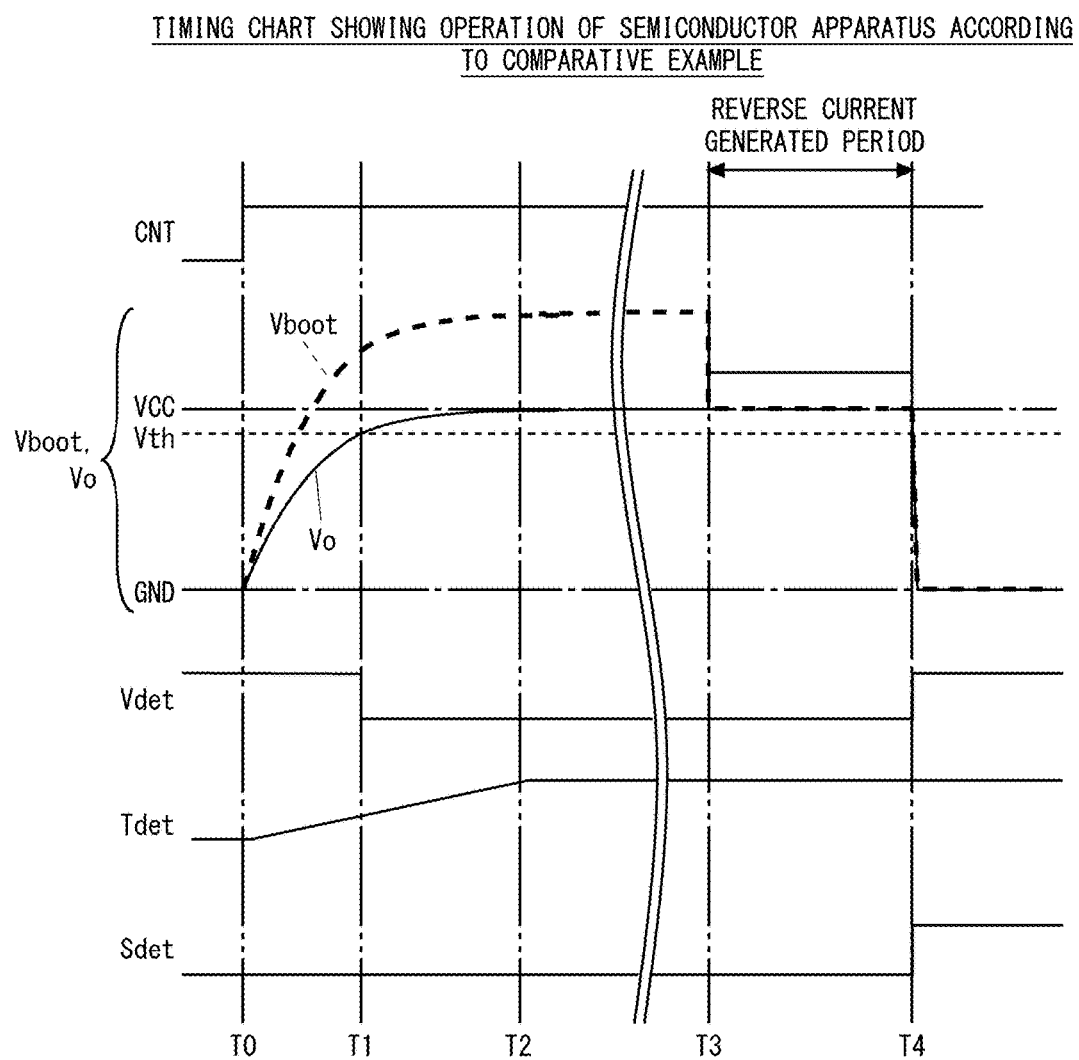
FIG. 9 is a timing chart for describing an operation of the semiconductor apparatus according to the comparative example when a reverse current occurs.

FIG. 9 is a timing chart for describing the operation of the semiconductor apparatus 100 according to the comparative example when the reverse current occurs. As shown in FIG. 9, in the semiconductor apparatus 100 according to the comparative example, when the control signal CNT is switched from the low level to the high level at the timing T0, the output signal Vboot of the booster circuit 11 is boosted to the boosted voltage. As the output signal Vboot rises, the output voltage Vout of the semiconductor apparatus 100 rises to be close to the power supply voltage VCC. At this time, when the output voltage Vo exceeds the first threshold voltage Vth at the timing T1, the output voltage detection block 14 switches the voltage determination signal Vdet from the high level to the low level. After that, in the semiconductor apparatus 100 according to the comparative example, although the count value Tdet is counted up to the maximum value at the timing T2, as the voltage determination signal Vdet is at the low level at the timing T1, the protection start signal Sdet remains at the low level at the timing T2.

After that, in the example shown in FIG. 9, the reverse current occurs in the period from the timing T3 to T4. In this reverse current generation period, the output voltage Vo becomes higher than the power supply voltage VCC. On the other hand, as a current is drawn from the gate of the power MOS transistor 10 by the parasitic transistor Tr_p, the output signal Vboot of the booster circuit 11 becomes a voltage close to the power supply voltage VCC.

When the state where the reverse current flows is canceled at the timing T4, the output voltage Vo is reduced to instantaneously become a voltage equal to or lower than the first threshold voltage Vth, and the output voltage detection block 14 switches the voltage determination signal Vdet from the low level to the high level. At the timing T4, the count value Tdet output from the timer block 15 remains at the state where it is counted up to the maximum value. Therefore, in response to the output voltage Vo falling below the first threshold voltage Vth at the timing T4, the protection circuit 12 switches the protection start signal Sdet from the low level to the high level to thereby turn on the protection transistor 13. As a result, from the timing T4 onward, the protection transistor 13 is turned on to turn off the power MOS transistor 10, thereby causing a problem in which the power MOS transistor 10 will not return to the on state even if the state where the reverse current occurs is canceled. This is a necessary function (referred to as a latch stop function) provided to prevent an abnormal state from being repeated by turning off the power MOS transistor 10 and maintaining the state where the power MOS transistor 10 is turned off when an abnormal state occurs. However, as occurrence of the reverse current is not considered to be an abnormal state, it is necessary to return the power MOS transistor 10 to the on state when the reverse current is stopped. However, in the semiconductor apparatus 100 according to the comparative example, there arises a problem the power MOS transistor 10 cannot be returned to the on state because the latch stop function operates when attempting to return the power MOS transistor 10 to the on state which has been in the off state due to the reverse current.

Next, the operation of the semiconductor apparatus 1 when the reverse current occurs in the semiconductor apparatus 1 according to the first embodiment will be described.

Figure 10:
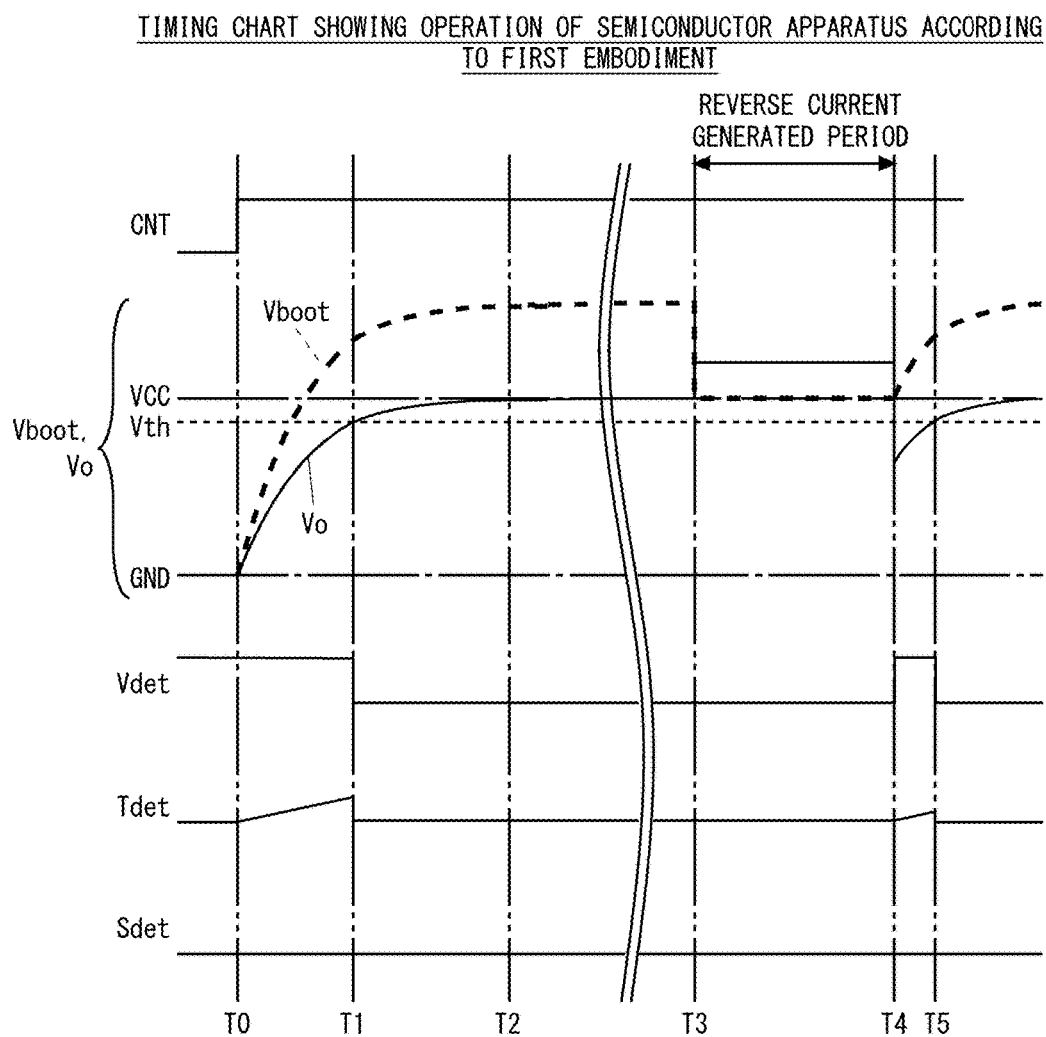
FIG. 10 is a timing chart for describing the operation of the semiconductor apparatus according to the first embodiment when a reverse current occurs.

FIG. 10 is a timing chart for describing the operation of the semiconductor apparatus according to the first embodiment when the reverse current occurs.

As shown in FIG. 10, also in the semiconductor apparatus 1 according to the first embodiment, the output signal Vboot of the booster circuit 11 is boosted to the boosted voltage in response to the control signal CNT being switched from the low level to the high level at the timing T0. Then, in the semiconductor apparatus 1 according to the first embodiment, the voltage determination signal Vdet is switched from the high level to the low level in response to the output voltage Vo exceeding the first threshold voltage Vth at the timing T1. In the semiconductor apparatus 1 according to the first embodiment, the count value Tdet of the timer block 15 is reset in response to the voltage determination signal Vdet becoming the low level. When the voltage determination signal Vdet is at the low level, the count value Tdet remains at the reset state. As described above, at the timing T2 when the count value Tdet reaches the maximum value in the semiconductor apparatus 100 according to the comparative example shown in FIG. 9, in the semiconductor apparatus 1 according to the first embodiment, the count value Tdet remains at the reset state.

Next, the reverse current occurs in a period from the timing T3 to T4. In the reverse current generation period, the output voltage Vo is higher than the power supply voltage VCC. On the other hand, as a current is drawn from the gate of the power MOS transistor 10 by the parasitic transistor Tr_p, and the output signal Vboot of the booster circuit 11 becomes a voltage close to the power supply voltage VCC.

When the state where the reverse current flows is canceled at the timing T4, the output voltage Vo is reduced to become a voltage equal to or lower than the first threshold voltage Vth. However, as the count value Tdet is at the reset value at the timing T4 in the semiconductor apparatus 1 according to the first embodiment, the protection start signal Sdet remains at the low level even if the voltage determination signal Vdet becomes the high level. Thus, in the first embodiment, as the protection transistor 13 remains at the off state from the timing T4 onward, the power MOS transistor 10 restarts its operation. Then, at the timing T5, the voltage determination signal Vdet is switched from the high level to the low level in response to the output voltage Vo exceeding the first threshold voltage Vth, and the count value Tdet is reset.

As described above, in the semiconductor apparatus 1 according to the first embodiment, even if the reverse current occurs in the period when the power MOS transistor 10 is in the on state, it is possible to return the operation of the power MOS transistor 10 if the state where the reverse current flows is canceled.

In particular, when the semiconductor apparatus 1 according to the first embodiment is mounted on an automobile or the like, the power supply voltage VCC is supplied from a power supply apparatus with a large fluctuation such as a battery. In such a case, if a capacitive load is connected as the load circuit LD, the power supply voltage VCC may temporarily fall below the output voltage Vo due to fluctuations in the power supply voltage VCC. Thus, the reverse current flows in the semiconductor apparatus 1 due to a temporary reduction in the power supply voltage VCC. Additionally, an inductive load may be connected as the load circuit. When an inductive load is used as the load circuit, the reverse current occurs due to the counter electromotive force. If the switch operation by the semiconductor apparatus 1 is stopped due to a temporary reduction in the power supply voltage VCC or due to the counter electromotive force of the load, there arises a problem, for example, that the entire system has to be stopped.

However, through the use of the semiconductor apparatus 1 according to the first embodiment, even when the reverse current occurs due to a temporary reduction in the power supply voltage VCC or due to the counter electromotive force occurring in the load, it is possible for the semiconductor apparatus 1 to supply power if the state where the reverse current flows is canceled. Accordingly, the semiconductor apparatus 1 according to the first embodiment allows the operation of the entire system to continue.

Additionally, in the semiconductor apparatus 1 according to the first embodiment, it is possible to further include the returning function from the reverse current state by adding only a small number of circuits to the semiconductor apparatus 100 according to the comparative example. That is, the semiconductor apparatus 1 according to the first embodiment can include additional functions without increasing the circuit size.

Second Embodiment

Figure 11:
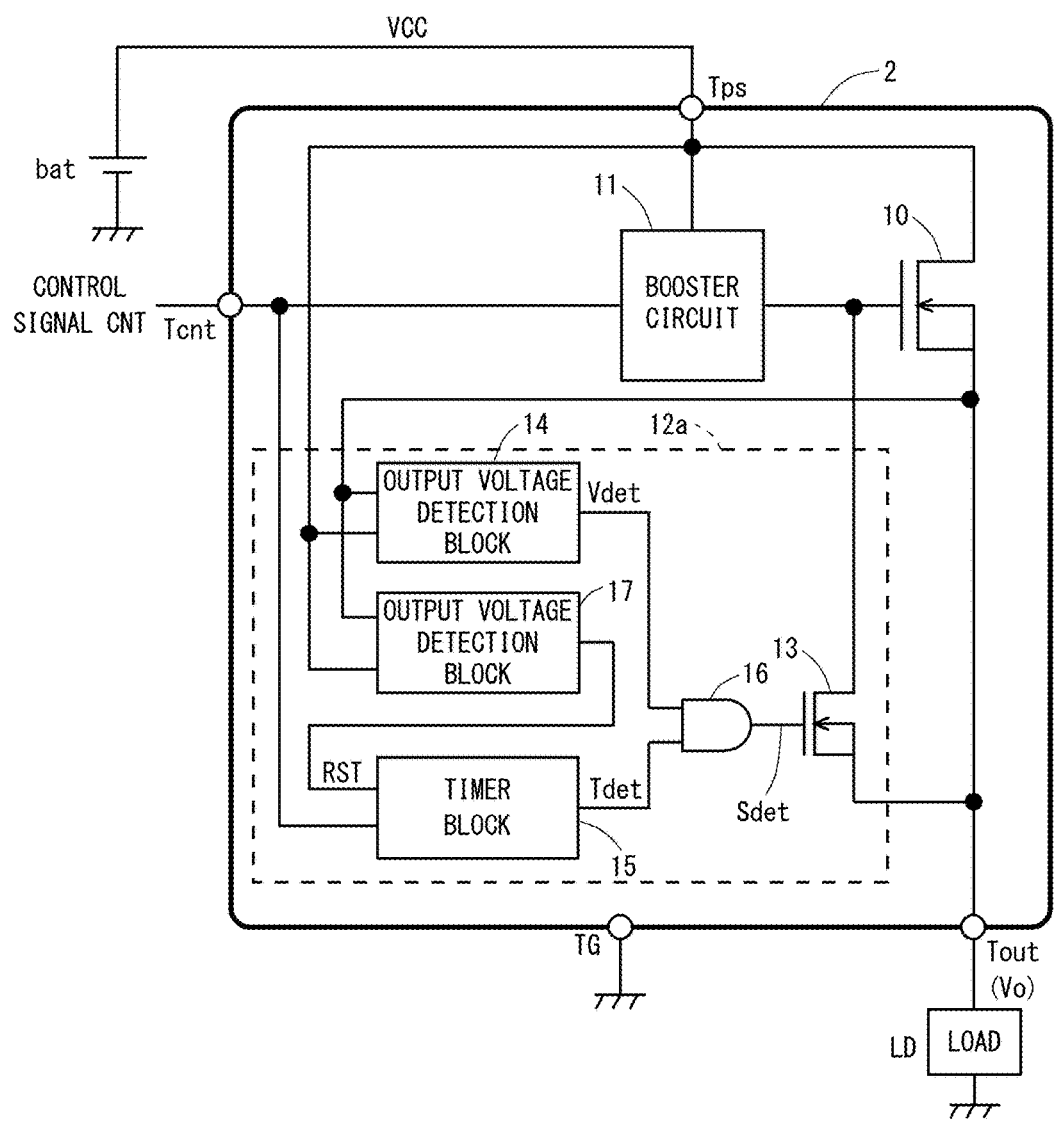
FIG. 11 is a block diagram of a semiconductor apparatus according to a second embodiment.

In a second embodiment, a protection circuit 12a that is another form of the protection circuit 12 will be described. FIG. 11 is a block diagram of a semiconductor apparatus 2 according to the second embodiment. In the second embodiment, the same components as those described in the first embodiment are denoted by the same reference signs as those in the first embodiment, and overlapping descriptions will be omitted.

As shown in FIG. 11, the semiconductor apparatus 2 according to the second embodiment includes a protection circuit 12a in place of the protection circuit 12. In addition to the components of the protection circuit 12, the protection circuit 12a further includes a reset determination circuit (e.g., output voltage detection block 17). The output voltage detection block 17 outputs a reset signal RST that is enabled in a period in which the source voltage of the power MOS transistor 10 is determined to be higher than a second threshold voltage Vth2, which is obtained by adding a predetermined second determination voltage Voff2 to the power supply voltage VCC. Note that in the semiconductor apparatus 2 according to the second embodiment, the first determination voltage set in the output voltage detection block 14 is referred to as Voff1, and the first threshold voltage is referred to as Vth1.

Further, in the protection circuit 12a according to the second embodiment, the timer block 15 does not reset the count value Tdet by the voltage determination signal Vdet but instead resets the count value Tdet in response to the reset signal RST becoming enabled.

Figure 12:
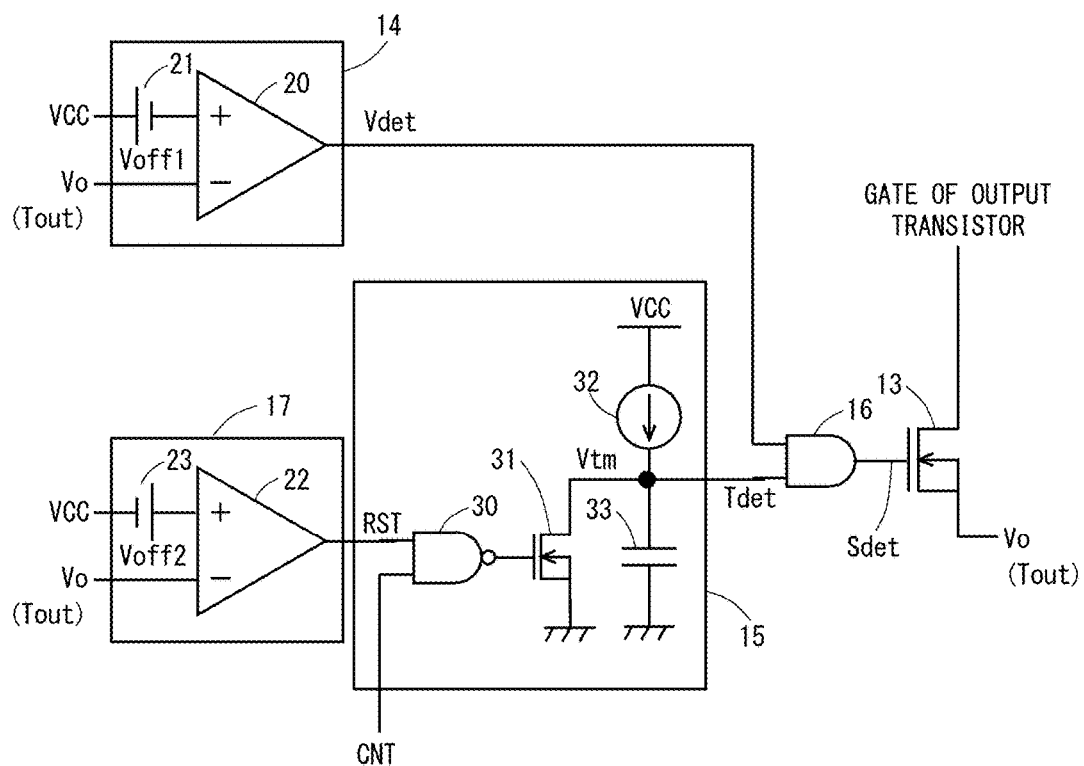
FIG. 12 is a block diagram of a protection circuit according to the second embodiment.

Next, an example of a specific circuit of the protection circuit 12a according to the second embodiment will be described. FIG. 12 is a block diagram of the protection circuit 12a according to the second embodiment. As shown in FIG. 12, the protection circuit 12a further includes the output voltage detection block 17. The output voltage detection block 17 includes a comparator 22 and a constant voltage source 23. In the comparator 22, the output voltage Vo is input to an inverting input terminal, and the second threshold voltage Vth2 obtained by adding the second determination voltage Voff2 to the power supply voltage VCC is input to a non-inverting input terminal. In the constant voltage source 23, a negative electrode is connected to the power supply line, and a positive electrode is connected to a non-inverting input terminal of the comparator 22. As the constant voltage source 23 is inserted between the power supply line and the non-inverting input terminal of the comparator 22, the second threshold voltage Vth2 obtained by adding the second determination voltage Voff2 to the power supply voltage VCC is supplied to the non-inverting input terminal of the comparator 22.

In the timer block 15 of the protection circuit 12a, the reset signal RST output by the output voltage detection block 17 is input to one input of the NAND circuit 30 instead of the voltage determination signal Vdet output by the output voltage detection block 14.

Figure 13:
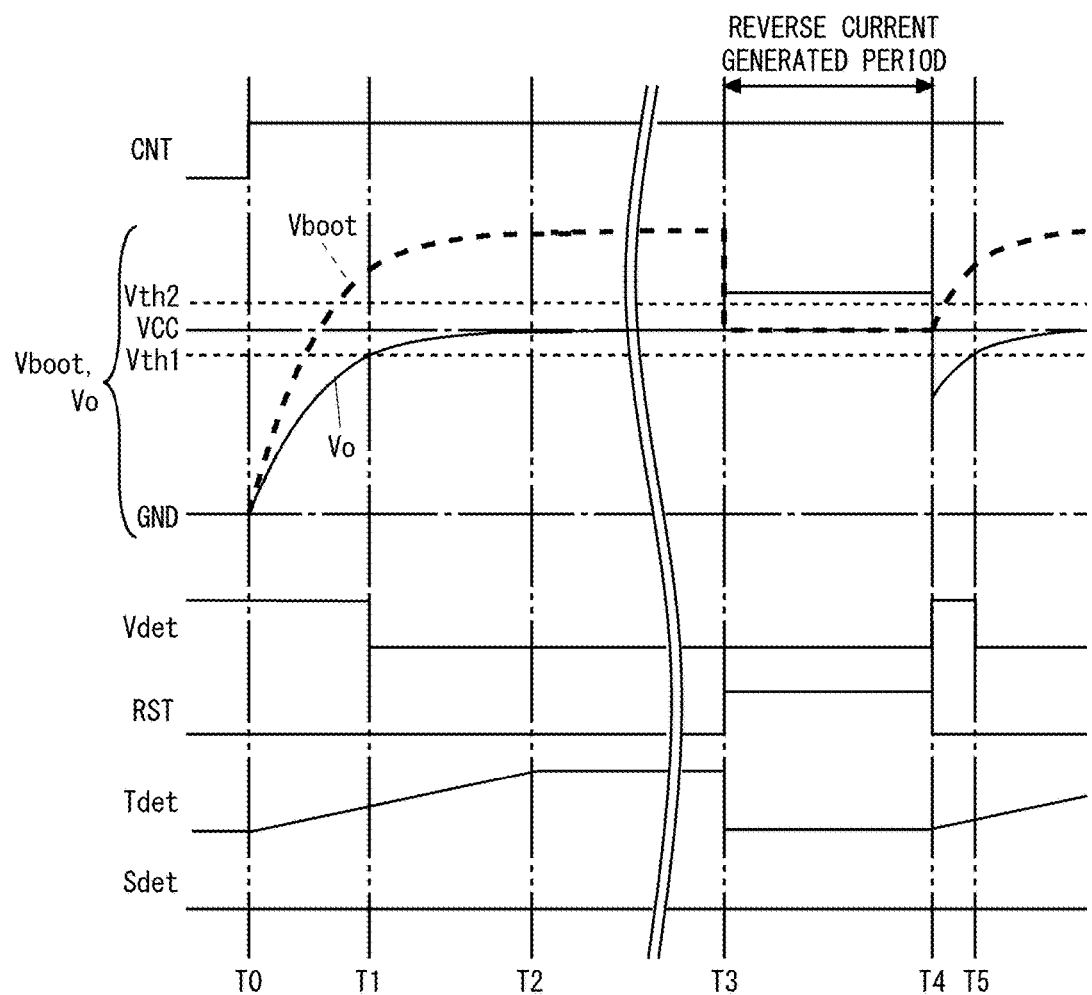
FIG. 13 is a timing chart for describing an operation of the semiconductor apparatus according to the second embodiment when a reverse current occurs.

Next, an operation of the semiconductor apparatus 2 according to the second embodiment will be described. Firstly, the operation when the reverse current occurs in the semiconductor apparatus 2 according to the second embodiment will be described. FIG. 13 is a timing chart for describing the operation of the semiconductor apparatus according to the second embodiment when the reverse current occurs.

As shown in FIG. 13, also in the semiconductor apparatus 2 according to the second embodiment, the output signal Vboot of the booster circuit 11 is boosted to the boosted voltage in response to the control signal CNT being switched from the low level to the high level at the timing T0. Then, in the semiconductor apparatus 2 according to the second embodiment, the voltage determination signal Vdet is switched from the high level to the low level in response to the output voltage Vo exceeding the first threshold voltage Vth1 at the timing T1. At this time, in the semiconductor apparatus 2 according to the second embodiment, since the reset signal RST remains at the low level during the period when the output voltage Vo is lower than the second threshold voltage Vth2, the count value Tdet of the timer block 15 will not be reset. Then, in the semiconductor apparatus 2 according to the second embodiment, at the timing T2, the count value Tdet of the timer block 15 reaches the maximum value and remains at the maximum value thereafter.

Next, the reverse current occurs in the period from timing T3 to T4. In this reverse current generation period, the output voltage Vo becomes higher than the second threshold voltage Vth2, which is set to be higher than the power supply voltage VCC. Therefore, in the reverse current generation period, the output voltage detection block 17 sets the reset signal RST to the high level. As a result, in the semiconductor apparatus 2 according to the second embodiment, the count value Tdet of the timer block 15 is reset.

Then, when the state where the reverse current flows is canceled at the timing T4, the output voltage Vo falls to the first threshold voltage Vth or less. In the semiconductor apparatus 1 according to the first embodiment, as the count value Tdet is at the reset value at the timing 4, the protection start signal Sdet remains at the low level even when the voltage determination signal Vdet becomes the high level. When the output voltage Vo falls below the second threshold voltage Vth2 at the timing T4, the output voltage detection block 17 switches the reset signal RST from the high level to the low level. Thus, in the second embodiment, as the protection transistor 13 remains at the off state from the timing T4 onward, the power MOS transistor 10 restarts its operation. Then, at the timing T5, the voltage determination signal Vdet is switched from the high level to the low level in response to the output voltage Vo exceeding the first threshold voltage Vth. Further, in the second embodiment, the timer block 15 counts up the count value Tdet to the maximum value from the timing T4 onward.

Figure 14:
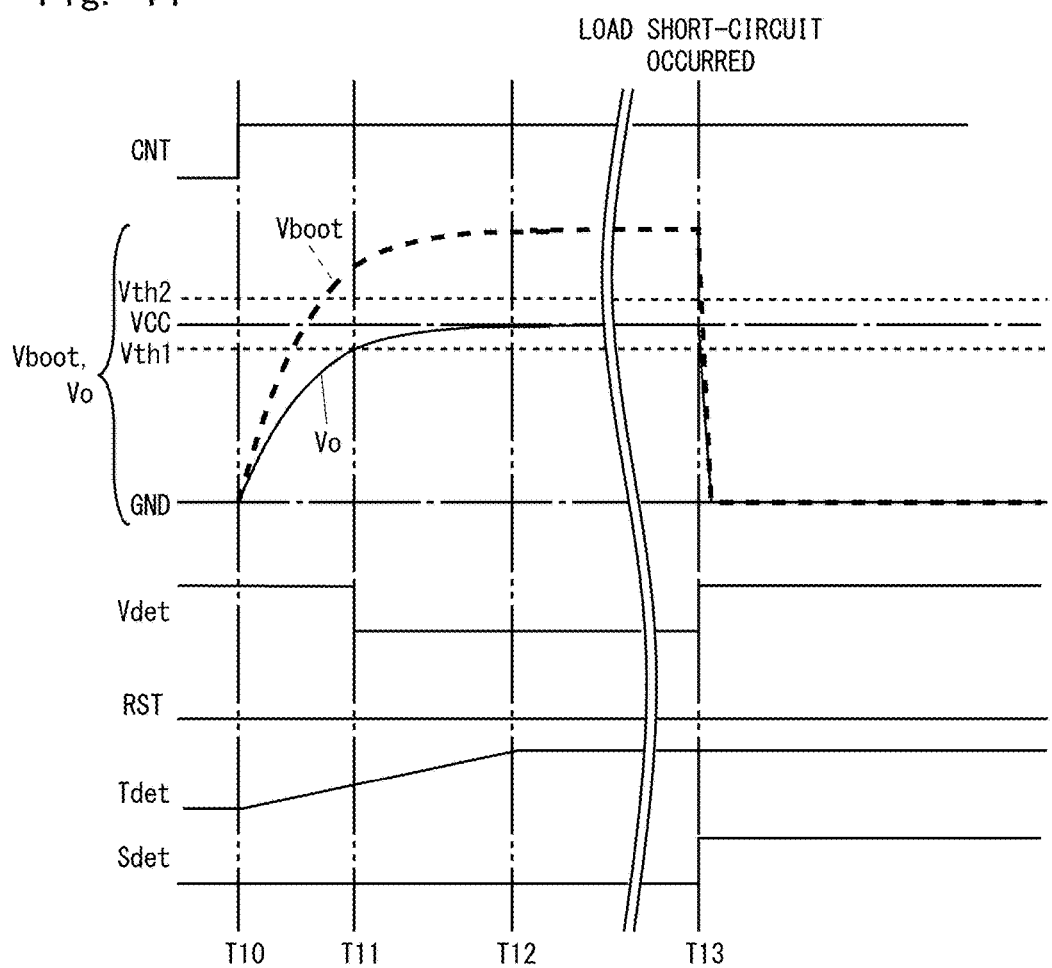
FIG. 14 is a timing chart for describing an operation of the semiconductor apparatus according to the second embodiment when a load short-circuit is generated.

Next, an operation of the semiconductor apparatus 2 according to the second embodiment when a load short-circuit occurs during the period when the power MOS transistor 10 supplies power to the load circuit LD will be described. FIG. 14 is a timing chart for describing the operation of the semiconductor apparatus 2 according to the second embodiment when a load short-circuit occurs.

As shown in FIG. 14, at and before the timing T13, i.e., in the period until the load short-circuit occurs, the operation from the timing T0 to T12 described with reference to FIG. 13 is performed. When the load short-circuit occurs at the timing T13, as the output voltage Vo falls below the first threshold voltage Vth1, the semiconductor apparatus 2 according to the second embodiment switches the voltage determination signal Vdet from the low level to the high level. At this time, in the semiconductor apparatus 2 according to the second embodiment, since the count value Tdet has been counted up to the maximum value, the protection start signal Sdet is immediately switched from the low level to the high level, and the protection transistor 13 is switched from the off state to the on state. Thus, in the semiconductor apparatus 2 according to the second embodiment, it is possible to protect the power MOS transistor 10 by turning off the power MOS transistor 10 immediately after the load short-circuit occurs.

It should be noted that in the semiconductor apparatus 1 according to the first embodiment, when the load short-circuit occurs during the period in which the power MOS transistor 10 supplies power to the load circuit LD, the operation of the protection transistor 13 for protecting the power MOS transistor 10 cannot be performed until the timer block 15 counts up the count value Tdet.

As described above, in the semiconductor apparatus 2 according to the second embodiment, in addition to the function of returning the power MOS transistor 10 to the on state after the reverse current occurs included in the semiconductor apparatus 2, it is possible to perform the operation for protecting the power MOS transistor 10 as soon as the load short-circuit occurs.

It should be noted that the function for returning the power MOS transistor 10 from the reverse current state described in the above embodiments is applicable to any semiconductor apparatus having a structure in which a parasitic transistor which is activated in the reverse current state is formed due to the structure of the protection transistor 13. For example, in a semiconductor apparatus in which circuit elements such as a transistor are formed on a semiconductor substrate having an N-epi layer that is formed on a P sub substrate is formed, the parasitic transistor described in the above embodiment is formed. Moreover, in the above embodiments, although the configuration in which the power MOS transistor 10, the booster circuit 11, and the protection circuit 12 are formed on one semiconductor substrate has been described, the function for returning from the reverse current, which has been described in the above embodiments, can be incorporated into a configuration in which the power MOS transistor 10 is formed on a semiconductor substrate different from a semiconductor substrate on which the booster circuit 11 and protection circuit 12 are formed.

Figure 15:
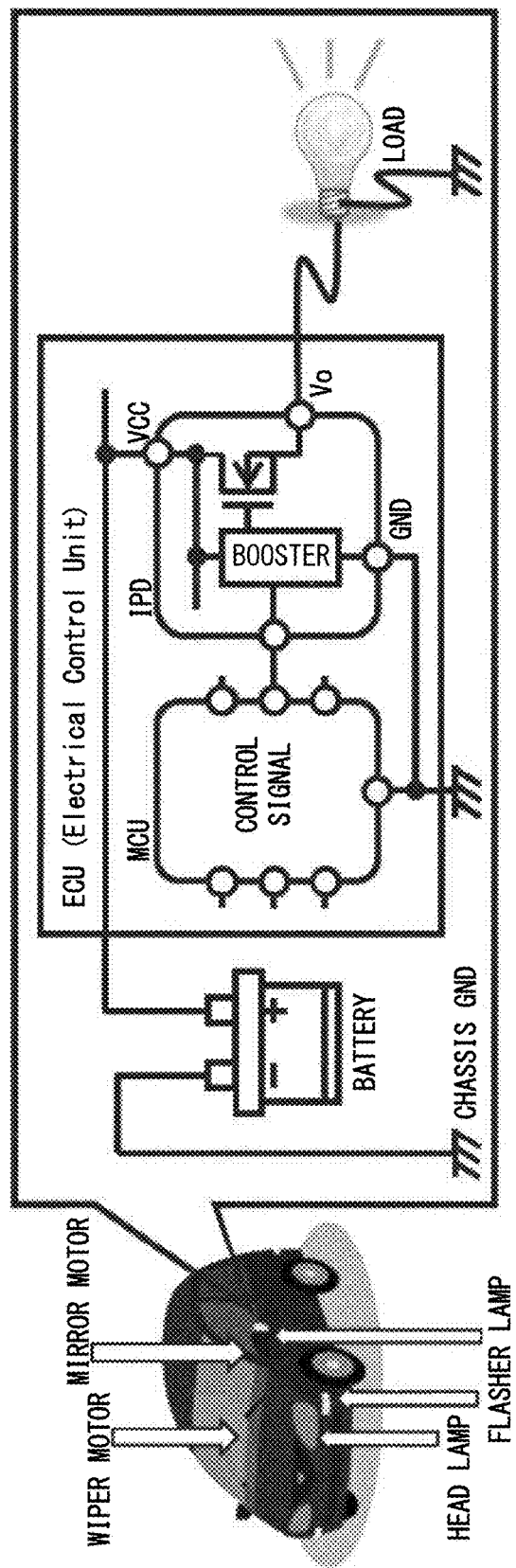
FIG. 15 is a drawing for describing a usage example of the semiconductor apparatus described in the first and second embodiments.

Moreover, the semiconductor apparatus described in the above embodiments is used as, for example, a component of an apparatus for driving a direction indicator, a headlamp, a wiper motor, a mirror motor, and the like of an automobile. FIG. 15 shows a usage example of the semiconductor apparatus described in the above embodiments.

As shown in FIG. 15, in automobiles, auxiliary devices such as a lamp and a motor are often used. Operation states of these auxiliary devices are switched in accordance with the user's instruction. Therefore, in automobiles, for example, an IPD (Intelligent Power Device) in which a control circuit (Micro Controller Unit: MCU), the power MOS transistor 10, the booster circuit 11 for controlling the power MOS transistor 10, the protection circuit 12, which have been described in the above embodiments, and the like are contained in one package may be used to control the operations of the respective auxiliary devices. The MCU and the IPD are supplied with operating power from a battery mounted on the car. As the load circuit, a light bulb, an LED light, a motor, and the like are connected to the semiconductor apparatus.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and second embodiments can be combined as desirable by one of ordinary skill in the art.

What is claimed is:

1. A semiconductor apparatus for driving a power MOS transistor having a drain being supplied with a power supply voltage and a source connected to a load circuit, the semiconductor apparatus comprising:
    an output voltage detection block configured to output a voltage determination signal that is enabled in a period in which a source voltage of a power MOS transistor is determined to be lower than a first threshold voltage, the first threshold voltage being obtained by subtracting a predetermined first determination voltage from the power supply voltage;
    a timer block configured to count up a count value to a predetermined value in response to a control signal being enabled, the control signal instructing the power MOS transistor to be turned on;
    a protection start instruction circuit configured to switch a protection start signal to be enabled in response to the voltage determination signal being enabled and the count value reaching the predetermined value; and
    a protection transistor including a gate to which the protection start signal is input, a drain connected to a gate of the power MOS transistor, a source and a back gate connected to a source of the power MOS transistor, and an epitaxial layer supplied with the power supply voltage, wherein the timer block resets the count value in response to the voltage determination signal being disabled.

2. The semiconductor apparatus according to claim 1, wherein the protection transistor is formed on an N-type substrate including an epitaxial layer being supplied with the power supply voltage.

3. The semiconductor apparatus according to claim 1, wherein the power MOS transistor and the protection transistor are formed on the same semiconductor substrate.

4. The semiconductor apparatus according to claim 3, wherein the power MOS transistor is an NMOS transistor having a vertical structure in which a current flows in a depth direction of the substrate.

5. The semiconductor apparatus according to claim 1, further comprising a reset determination circuit configured to output a reset signal that is enabled in a period in which the source voltage of the power MOS transistor is determined to be higher than a second threshold voltage, the second threshold voltage being obtained by adding a predetermined second determination voltage to the power supply voltage, wherein the timer block does not reset the count value by the voltage determination signal and instead resets the count value in response to the reset signal being enabled.

6. The semiconductor apparatus according to claim 1, further comprising a booster circuit configured to supply a boosted voltage to the gate of the power MOS transistor in accordance with the control signal, the boosted voltage being obtained by boosting the power supply voltage.

* * * * *